US012775035B2

(12) United States Patent
Zhang et al.

(10) Patent No.: US 12,775,035 B2
(45) Date of Patent: Oct. 27, 2026

(54) CIRCUITS AND METHODS FOR PRECISE CAPACITANCE MEASUREMENT

(71) Applicant: CHIPSEMI SEMICONDUCTOR (NINGBO) CO., LTD., Ningbo (CN)

(72) Inventors: Yaoguo Zhang, Ningbo (CN); Bo Xia, Ningbo (CN); Bo Nie, Ningbo (CN); Yulin Zhang, Ningbo (CN)

( * ) Notice: Subject to any disclaimer, the term of this patent is extended or adjusted under 35 U.S.C. 154(b) by 213 days.

(21) Appl. No.: 18/638,750

(22) Filed: Apr. 18, 2024

(65) Prior Publication Data

US 2024/0272214 A1 Aug. 15, 2024

Related U.S. Application Data

(63) Continuation of application No. PCT/CN2022/099288, filed on Jun. 16, 2022.

(30) Foreign Application Priority Data

Apr. 6, 2022 (CN) ......................... 202210352792.3

(51) Int. Cl.
*G01R 27/26* (2006.01)
*G01D 5/24* (2006.01)

(52) U.S. Cl.
CPC ......... *G01R 27/2605* (2013.01); *G01R 27/26* (2013.01); *G01D 5/24* (2013.01)

(58) Field of Classification Search
CPC ........ G01R 27/00; G01R 27/02; G01R 27/26; G01D 5/00; G01D 5/12; G01D 5/14
USPC ................................. 324/600, 649, 658, 686
See application file for complete search history.

(56) References Cited

U.S. PATENT DOCUMENTS 6,140,928 A * 10/2000 Shibuya ................ H01M 10/48 324/426
6,278,283 B1 8/2001 Tsugai
8,054,089 B2 * 11/2011 Hauer ................ G01R 27/2605 324/519

(Continued)

FOREIGN PATENT DOCUMENTS

CN 102435864 A 5/2012
CN 103155417 A * 6/2013 ............... G01D 5/24

(Continued)

OTHER PUBLICATIONS

The international search report received in the counterpart international application PCT/CN2022/099288, mailed on Dec. 14, 2022.

*Primary Examiner* — Hoai-An D. Nguyen

(57) ABSTRACT

The present invention relates to the microelectronics domain, specifically to a capacitance measurement circuit and method designed to enhance precision in capacitance measurements. The circuit comprises a capacitor under test, which is connected at one end to the output of an excitation circuit and at the other end to the input of an adjustment circuit. It includes a first timing switch circuit connected between the input of a first amplification circuit and the output of the adjustment circuit, and a second timing switch circuit connected between the input of a second amplification circuit and the output of the adjustment circuit, with the first and second timing switch circuits operating alternately. The invention also features a capacitance detection circuit that consists of a differential amplifier and a comparator.

10 Claims, 2 Drawing Sheets

(56) References Cited

U.S. PATENT DOCUMENTS

| | | | | |
|---|---|---|---|---|
| 8,194,892 | B2 * | 6/2012 | Seven | H03F 3/45179<br>330/124 R |
| 8,866,497 | B2 * | 10/2014 | Caldwell | G06F 3/0418<br>345/173 |
| 9,348,470 | B2 * | 5/2016 | Brown | G06F 3/0446 |
| 2008/0079444 | A1 * | 4/2008 | Denison | G01D 5/24<br>324/679 |
| 2008/0122454 | A1 * | 5/2008 | Kato | G01D 3/032<br>324/661 |
| 2014/0093089 | A1 * | 4/2014 | Gasparini | H04R 19/013<br>381/59 |

FOREIGN PATENT DOCUMENTS

| | | | | | |
|---|---|---|---|---|---|
| CN | 104205025 | A | * | 12/2014 | G06F 3/0446 |
| CN | 113922776 | A | | 1/2022 | |
| CN | 114487615 | A | | 5/2022 | |
| CN | 118209787 | A | * | 6/2024 | G01R 27/2605 |
| EP | 0913698 | A1 | * | 5/1999 | H01M 10/48 |
| JP | 2008157920 | A | * | 7/2008 | G01R 27/26 |

* cited by examiner

CIRCUITS AND METHODS FOR PRECISE CAPACITANCE MEASUREMENT

CROSS-REFERENCES TO RELATED APPLICATIONS

This application is a continuation of an international application with application number PCT/CN2022/099288, filed on Jun. 16, 2022, which claims priority to a Chinese patent application with application number 202210352792.3, filed on Apr. 6, 2022, the entire content of which is hereby incorporated by reference into this application.

FIELD OF THE INVENTION

The invention described in this application relates to the field of microelectronics, specifically to capacitance measurement circuits and capacitance measurement methods.

BACKGROUND OF THE INVENTION

The Capacitors typically produce small capacitance outputs, ranging from 0.01 femtofarads (fF) to 10 picofarads (pF). These outputs can be compromised by stray and parasitic capacitances originating from the sensors and their connecting cables. Such interference weakens the capacitance measurement circuit's ability to accurately capture signals. Furthermore, the precision of measurements can be influenced by the capacitive distribution that occurs both before and after the capacitor undergoing tests. This results in a decrease in the overall accuracy of the capacitance measurement circuit.

Therefore, addressing these technical challenges becomes crucial to enhance the circuit's performance and reliability.

SUMMARY OF THE INVENTION

The present disclosure presents a few novel circuits and methods for precise capacitance measurements. This comprehensive approach, as outlined across various embodiments, signifies a significant advancement in capacitance measurement technology, promising increased accuracy and reliability in microelectronics applications.

The capacitance measurement circuit comprises an excitation circuit, a regulation circuit, and a capacitor under test. The capacitor being measured connects to the output of the excitation circuit at one end and to the input of the regulation circuit at the other end.

The capacitance measurement circuit also includes an integration comparison circuit, which is electrically connected to the regulation circuit. This integration comparison circuit features first and second timing switch circuits and first and second amplification circuits. The first timing switch is connected to the input of the first amplification circuit and the output of the regulation circuit, while the second timing switch connects to the input of the second amplification circuit and the output of the regulation circuit. These switches are turned on alternately to aid in the measurement process.

Additionally, a capacitance detection circuit, equipped with a differential amplifier and a comparator, enhances the detection accuracy. The differential amplifier's inputs are connected to the outputs of the first and second amplification circuits, facilitating improved signal discrimination.

In some embodiments, the capacitance detection circuit includes: a quantization circuit and a Digital-to-Analog converter (DAC) to further refine measurement precision. The output from the comparator feeds into the DAC, whose outputs link back to the inputs of the first and second amplification circuits.

The DAC is tailored to work with the amplification circuits, ensuring that it accurately processes common-mode signals from the outputs of both amplification circuits for better measurement accuracy.

Each amplification circuit features a unique setup involving an amplifier, a capacitor, and a switch, allowing for precise measurement control. This setup is replicated in both the First and Second Amplification Circuits.

The regulation circuit incorporates a variable capacitor, an amplifier and a switch, enabling fine adjustments to optimize measurement conditions. It also includes a common-mode signal input to further enhance measurement precision.

The detailed design presented here represents a significant improvement in capacitance measurement technology, addressing the issues identified above and offering greater accuracy and reliability for microelectronics applications.

In some embodiments, the output voltage ($V_{out}$) from the third amplifier is related to the excitation voltage ($V_{drv}$) produced by the excitation circuit in the following way:

$$V_{out}/V_{drv} = -(A \cdot C_s)/[(A+1) \cdot C_{int} + C_s]$$

Wherein, A is the amplification factor of the third amplifier, Cs is the capacitance value of the capacitor to be measured, and Cint is the capacitance value of the variable capacitor.

In some embodiments, the capacitance measurement circuit features an additional component: an excitation capacitor. This excitation capacitor is connected at one end to the regulation circuit and at the other end to the integration comparison circuit.

This application also discloses methods for measuring capacitance. One method includes the following steps: First, provide a capacitance measurement circuit from the previously described circuits. During the capacitor's charge sampling phase, connect the capacitor under test to the excitation circuit. Control a first, a second and a third timing switches to the 'on' state as dictated by the capacitor control signal. In the integration phase, transfer the sampled charge from the test capacitor into the measurement circuit. Manage the activation of the first timing switch circuit and the sequential activation of the second timing switch circuit based on the control signal. Finally, convert the accumulated charge in the measurement circuit into a voltage signal, and calculate the capacitance value of the test capacitor using this voltage.

The advantages of the invention will become apparent to those skilled in the art considering the following drawings and detailed descriptions.

BRIEF DESCRIPTION OF THE DRAWINGS

One or more embodiments are exemplified through the images in the corresponding drawings. These illustrations do not limit the scope of the embodiments, and elements with the same reference numbers in the drawings are similar elements, unless specifically stated otherwise. The drawings are not necessarily to scale.

DETAILED DESCRIPTION OF EMBODIMENTS

The embodiments of this application provide capacitor measurement circuits and methods, which address the challenges mentioned above and significantly improve the accuracy of capacitor measurement.

The technical solutions disclosed in this application offer at least the following advantages: The first amplifier circuit, the second amplifier circuit, and the differential amplifier constitute a differential system. If there is low-frequency signal interference from the outside, this interference signal passes through the excitation circuit and is further transmitted to the first and second amplifier circuits. After the differential operation of the differential amplifier, the low-frequency interference signal will be eliminated, thus the entire differential system has strong low-frequency suppression capability. Furthermore, the integration comparison circuit and the capacitor detection circuit form a closed-loop circuit. The signal value collected by the capacitor undergoes multiple comparisons through the integration comparison circuit and the capacitor detection circuit, achieving negative feedback control and conversion of the current signal through the capacitor to be measured. This ensures dynamic balance between the current of the capacitor to be measured and the reference capacitor current, enhancing the stability and acquisition accuracy of the capacitor detection.

To better illustrate the objectives, technical solutions, and advantages of the embodiments of this application, the following disclosure will detail the embodiments of this application in conjunction with the accompanying drawings. However, those skilled in the art will appreciate that the embodiments include numerous technical details to enhance understanding of the application. Despite this, the technical solutions sought to be protected by this application can be realized even without some of these technical details. Various alterations and modifications can be made based on the described embodiments.

Figure 1:
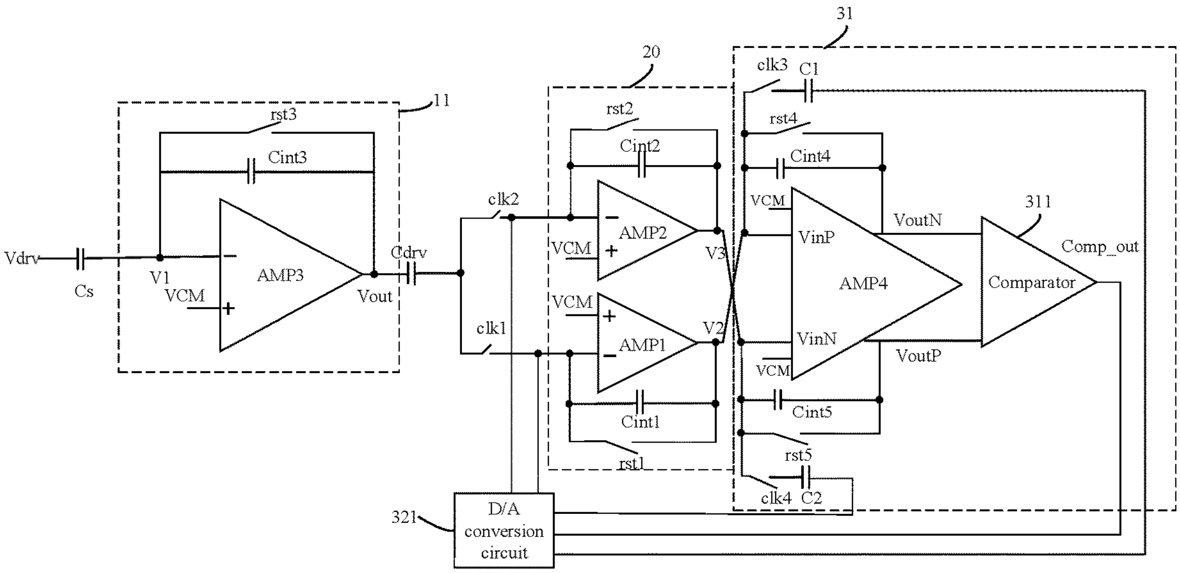
FIG. 1 shows a schematic diagram illustrating the circuit connections for an embodiment of a capacitor measurement circuit in accordance with the present disclosure.

FIG. 1 is a schematic diagram illustrating the circuit connections for an embodiment of a capacitor measurement circuit in accordance with the present disclosure. In FIG. 1, the capacitor measurement circuit 100 consists of an excitation circuit 10 (only the output Vdrv is shown), an adjustment circuit 11, an integration comparison circuit 20, and a capacitance detection circuit 31 and the capacitor to be measured Cs. The two ends of capacitor Cs are respectively connected to the output of excitation circuit 10 and the input of adjustment circuit 11. The output of adjustment circuit 11 is connected to the input of integration comparison circuit 20. Integration comparison circuit 20 includes a first timing switch circuit $clk_1$, a second timing switch circuit $clk_2$, a first amplification circuit 21, and a second amplification circuit 22. The two ends of the first timing switch circuit clk1 are respectively connected to the input end of the first amplification circuit 21 and the output end of the adjustment circuit 11. The two ends of the second timing switch circuit clk2 are respectively connected to the input end of the second amplification circuit 22 and the output end of the adjustment circuit 11. The first timing switch circuit clk1 opens alternately with the second timing switch circuit clk2.

The capacitance detection circuit (30) is comprised of two main components: a differential amplifier (AMP4) and a comparator (311). The differential amplifier AMP4 receives two types of input signals: an in-phase input (VinP) and an anti-phase input (VinN). The in-phase input (VinP) is directly connected to the output of the first amplification circuit (21), while the anti-phase input (VinN) is linked to the output of the second amplification circuit (22). The output from the differential amplifier AMP4 is then fed into comparator 311. Following this, the comparator's output passes through a digital-to-analog converter (DAC 321), before being routed to the input ends of both the first and second amplification circuits (21 and 22). This setup ensures a coherent flow of signals for effective capacitance detection and amplification.

The capacitor measurement circuit mentioned above has a wide range of applications, including testing equipment for aerospace, aviation, and naval sectors, as well as electronic devices like laptops, mobile phones, and digital cameras.

In some embodiments, the excitation circuit outputs an excitation voltage Vdrv. The excitation circuit can act as an excitation terminal, generating an excitation signal for the capacitor under test Cs. In other words, the excitation circuit can function as a power source and have Vdrv connecting to the front end of Cs, and the other end of Cs connects to the input to the amplification circuit.

Figure 2:
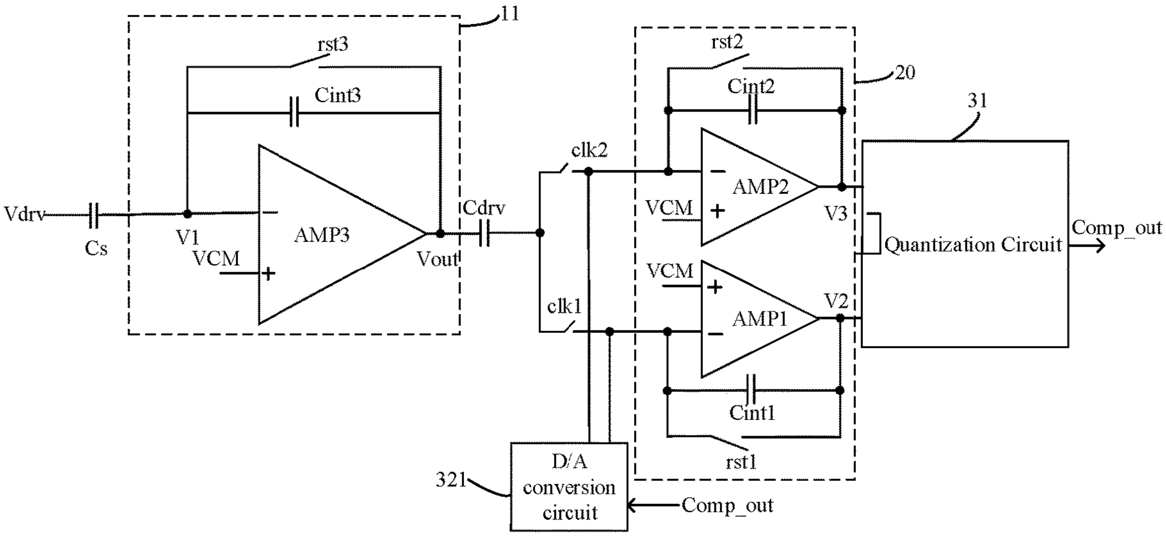
FIG. 2 shows a schematic diagram of a partial circuit connection for an embodiment of a capacitor measurement circuit in accordance with the present disclosure.
Figure 3:
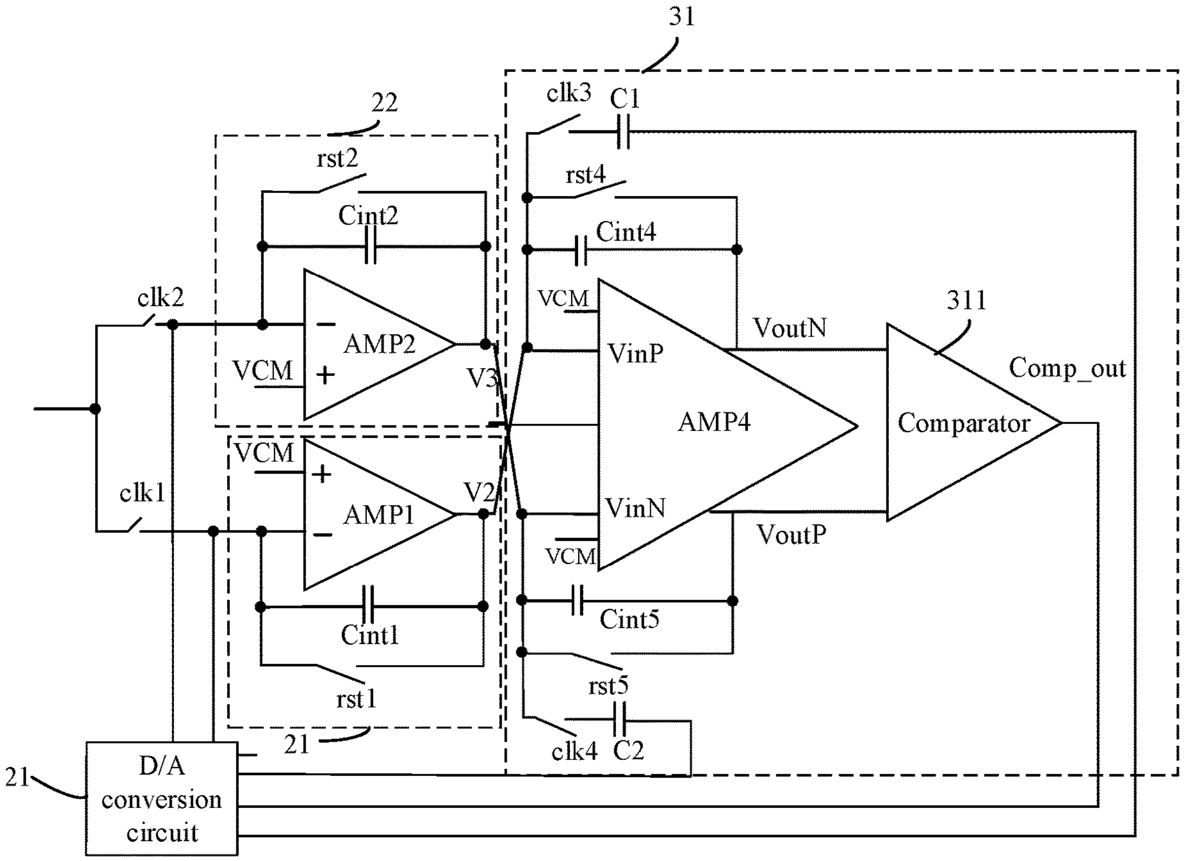
FIG. 3 illustrates a schematic diagram of a partial circuit connection for another embodiment of a capacitor measurement circuit in accordance with the present disclosure.

In some embodiments, as can be seen in FIGS. 1-3, the adjustment circuit 11 incorporates three key components: a variable capacitor Cint3, a third amplifier AMP3, and a third switch rst3 and configured as follows:

One terminal of the variable capacitor (Cint3) is linked to three points: the negative input terminal of AMP3, the input terminal of rst3, and the output from the capacitor being tested (Cs). The opposite terminal of Cint3 connects to two points: the output terminal of AMP3 and the output terminal of rst3. Additionally, the positive input terminal of AMP3 is designed to receive a common-mode signal VCM.

This setup ensures that Cint3 functions within the circuit to facilitate adjustments, potentially affecting the measurement or processing of the signal from the capacitor under test (Cs), with AMP3 amplifying the signal and rst3 providing switching capabilities for circuit configuration or reset purposes.

In some embodiments, the capacitance of the variable capacitor Cint3 can be adjusted within a specific range. This adjustment allows for changes in the gain value of the capacitor measurement circuit, thereby increasing the difference between the maximum and minimum measurable capacitance values. Such an adjustment further enhances the accuracy of the capacitance measurements.

Having detailed the embodiments illustrated in FIGS. 1-3, let us now delve into the theoretical foundation underpinning these configurations, including the relevant formulas and calculations that guide their design and functionality.

Rs represents the impedance corresponding to the capacitor under test Cs, and Rint3 represents the impedance corresponding to the variable capacitor Cint3. Based on the formula for calculating impedance, the following equation can be derived:

$$Rs = 1/(Cs * s) \tag{1}$$

$$Rint3 = 1/(Cint3 * s) \tag{2}$$

Here, s=jω, where j is the imaginary unit, and ω is the angular frequency.

Based on the operational amplifier calculation formula for the third op-amp AMP3, we can obtain:

$$(Vcm - V1) * A = V_{out} \tag{3}$$

$$(V1 - Vdrv)/Rs = (Vout - V1)/Rint3 \tag{4}$$

Wherein, A represents the amplification factor of the third amplifier AMP3, and V1 is the voltage between the capacitor under test Cs and the variable capacitor Cint3, which also corresponds to the voltage at the negative input terminal of the third operational amplifier AMP3. From the four equations provided, we can derive equation (5), which expresses the relationship between the output voltage Vout of the third amplifier AMP3 and the excitation voltage Vdrv produced by the excitation circuit.

$$Vout/Vdrv = -(A * Cs)/[(A + 1) * Cint3 + Cs] \tag{5}$$

Since the value of A is generally quite large, often amplifying the voltage by thousands or even tens of thousands of times to meet the amplifier's own performance requirements, equation (5) can be approximated as equation (6).

$$Vout/Vdrv = -Cs/Cint3 \tag{6}$$

Based on equation (6), we can determine that by applying a specific excitation voltage Vdrv alongside adjusting the variable capacitor Cint3, it's possible to translate the capacitance of the capacitor under test (Cs) into a corresponding output voltage (Vout). Furthermore, for any given capacitor under test (Cs), altering the capacitance of Cint3 allows for the generation of varying output voltages (Vout) at the same excitation voltage (Vdrv). In essence, modifying the capacitance of the variable capacitor Cint3 is a way to adjust the gain of the circuit.

Turning back to FIGS. 1-3, in some embodiments, the first amplification circuit (21) consists of a first amplifier (AMP1), a first capacitor (Cint1), and a first switch (rst1). One end of the first capacitor (Cint1) is connected to the negative input terminal of AMP1, a first timing switch circuit (clk1), and the first switch (rst1). The other end of Cint1 is connected to the output terminal of AMP1 and the other terminal of the first switch (rst1).

Similarly, the second amplification circuit (22) includes a second amplifier (AMP2), a second capacitor (Cint2), and a second switch (rst2). One terminal of the second capacitor (Cint2) connects to the negative input terminal of AMP2, a second timing switch circuit (clk2), and the second switch (rst2). The other terminal of Cint2 connects to the output terminal of AMP2 and the other terminal of the second switch (rst2).

Figure 4:
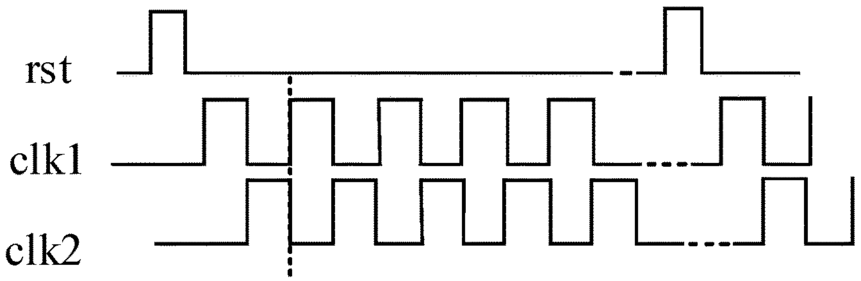
FIG. 4 is a timing diagram of signal processing for an embodiment of a capacitor measurement circuit in accordance with the present disclosure.

FIG. 4 is a timing diagram of signal processing for some embodiments of a capacitor measurement circuit in accordance with the present disclosure. In some embodiments, the first switch rst1, the second switch rst2, and the third switch rst3 are controlled by the same control unit. That is, the rst shown in FIG. 4 can be considered as any one of the first switch rst1, the second switch rst2, and the third switch rst3. When the rst (rst1, rst2 or rst3) is at a high level, switches rst1, rst2, and rst3 are in the closed state, meaning the capacitor measurement circuit is not operational. Conversely, when the rst is at a low level, switches rst1, rst2, and rst3 are in the open state, indicating the capacitor measurement circuit begins its operation. One cycle of the rst signal defines one measurement cycle for the capacitor. When the first timing switch circuit (clk1) outputs a high level, clk1 is in the closed (conducting) state. Conversely, when clk1 outputs a low level, it is in the open (non-conducting) state, ready to begin operation. Similarly, the second timing switch circuit (clk2) is in the closed state when it outputs a high level and in the open state when it outputs a low level, indicating readiness for operation.

Referring to both FIG. 2 and FIG. 4, the capacitor measurement circuit begins operation when the first switch (rst1), the second switch (rst2), and the third switch (rst3) are open (non-conducting). When the first timing switch circuit (clk1) and the second timing switch circuit (clk2) are in the conducting state, they charge the first capacitor (Cint1) and the second capacitor (Cint2) respectively. This process completes the sampling of the capacitor under test (Cs), resulting in the corresponding output voltage (Vout).

Specifically, when rst1, rst2, and rst3 are open, and clk1 is conducting while clk2 is open (non-conducting), Cint1 is charged. For a given drive capacitor (Cdrv) and the first capacitor (Cint1), according to formula (7) below, the first output voltage (V2) after passing through the second stage amplifier can be determined.

By combining formulas (7) and (6), we obtain formula (8), which allows for determining the first amplified output voltage (V2) corresponding to the capacitor under test (Cs) given specified excitation voltage (Vdrv), first capacitor (Cint1), and variable capacitor (Cint3). This achieves the conversion of the capacitor signal of Cs into a voltage signal.

$$V2/Vout = -Cdrv/Cint1 \tag{7}$$

$$V2/Vdr = Cs * Cdrv/(Cint3 * Cint1) \tag{8}$$

By the same principle, through the second amplification circuit (22), when the first switch (rst1), the second switch (rst2), and the third switch (rst3) are open (non-conducting), with the first timing switch circuit (clk1) open and the second timing switch circuit (clk2) in the conducting state, the second capacitor (Cint2) is charged. Given a specified drive capacitor (Cdrv) and the second capacitor (Cint2), formula (9) can be used to determine the second output voltage (V3) after passing through the second stage amplifier.

$$V3/Vout = -Cdrv/Cint2 \tag{9}$$

By integrating formulas (9) and (6), we obtain formula (10).

$$V3/Vdrv = Cs*Cdrv/(Cint3*Cint2) \quad (10)$$

This formula indicates that for a specified excitation voltage (Vdrv), the second capacitor (Cint2), and the variable capacitor (Cint3), it is possible to determine the second amplified output voltage (V3) corresponding to the capacitor under test (Cs), facilitating the conversion of Cs's capacitance signal into a voltage signal.

In view of the above and as illustrated in FIGS. 1-3, the structure of the first amplification circuit (21), the second amplification circuit (22), and the connections between their components are either identical or similar. Therefore, by changing the first capacitor (Cint1) and the second capacitor (Cint2), the circuit's gain value can be modified.

Figure 5:
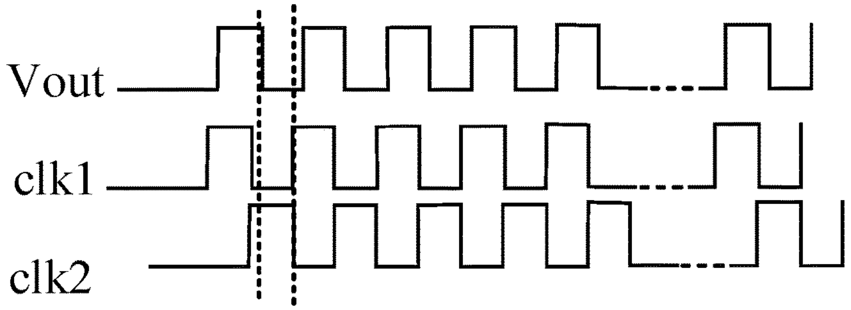
FIG. 5 is a timing diagram of signal processing for another embodiment of a capacitor measurement circuit in accordance with the present disclosure.

FIG. 5 is a timing diagram of signal processing for another embodiment of a capacitor measurement circuit in accordance with the present disclosure. In FIG. 5, the sampling process for the output voltage (Vout) is depicted in the timing diagram shown. With varying excitation signals (Vdrv), the output voltage (Vout) will correspondingly change, as illustrated by the timing waveform of the output voltage (Vout).

Specifically, referring to both FIG. 2 and FIG. 5, when the first timing switch circuit (clk1) is in a high state and the second timing switch circuit (clk2) is in a low state, the first timing switch is activated (connected), and the timing switch corresponding to clk2 is deactivated (disconnected). At the rising edge of Vout, the first capacitor (Cint1) facilitates charge transfer, while the second capacitor (Cint2) remains inactive. As a result, the integration comparison circuit (20) outputs the first output voltage (V2) corresponding to the capacitor under test (Cs) from the first amplification circuit (21), effectively doubling its amplification. This is essentially the first amplifier (AMP1) amplifying the low-voltage sample of the output voltage (Vout).

Conversely, when the first timing switch circuit (clk1) is in a low state and the second timing switch circuit (clk2) is in a high state, the first timing switch is deactivated (disconnected), and the timing switch corresponding to clk2 is activated (connected). At this rising edge of Vout, the first capacitor (Cint1) remains inactive, while the second capacitor (Cint2) carries out charge transfer. Consequently, the integration comparison circuit 20 outputs the second amplified output voltage V3 corresponding to the capacitor under test (Cs), after being amplified twice by the second amplifier AMP2, which samples and amplifies the high voltage of the output voltage Vout. Through this sequence of control, a differential sampling process of the output voltage Vout signal is achieved.

In some embodiments, see, e.g., FIG. 2, the capacitance detection circuit (30) includes a quantization circuit (31) and a digital-to-analog (D/A) conversion circuit (321). The quantization circuit (31) comprises a differential amplifier (AMP4) and a comparator (311), with the output of the comparator (311) connected to the input of D/A conversion circuit 321. The output of D/A conversion circuit 321 is connected to the inputs of both the first amplification circuit (21) and the second amplification circuit (22).

FIG. 3 illustrates a schematic diagram of a partial circuit connection for another embodiment of a capacitor measurement circuit in accordance with the present disclosure. In some embodiments, the quantization circuit (31) may further include a fourth amplification circuit, a fifth amplification circuit, a first measurement circuit, and a second measurement circuit.

The fourth amplification circuit includes a fourth capacitor (Cint4) and a fourth switch (rst4), with one end of Cint4 connected to the non-inverting input of AMP4 and rst4, and the other end connected to the output of AMP4 and the other side of rst4.

The fifth amplification circuit consists of a fifth capacitor (Cint5) and a fifth switch (rst5), with one end of Cint5 connected to the inverting input of AMP4 and rst5, and the other end connected to the output of AMP4 and the other side of rst5.

The first measurement circuit is used to collect the capacitance value (C1) corresponding to the first output voltage (V2), and the second measurement circuit is used to collect the capacitance value (C2) corresponding to the second output voltage (V3).

The first measurement circuit is connected at one end to the first amplification circuit (21) and at the other end to the D/A conversion circuit. The first measurement circuit includes a third timing switch circuit (clk3) connected to a capacitor (C1). The second measurement circuit is connected at one end to the second amplification circuit (22) and at the other end to the D/A conversion circuit; it includes a fourth timing switch circuit (clk4) connected to another capacitor (C2).

In some embodiments, the output of the D/A conversion circuit is connected to the inverting input of the first amplifier (AMP1) in the first amplification circuit (21), and similarly, the D/A conversion circuit output is connected to the inverting input of the second amplifier (AMP2) in the second amplification circuit (22).

In some embodiments, the Digital-to-Analog (D/A) conversion circuit features a D/A converter (321). This converter generates the common-mode signal (VCM) using the first output voltage (V2) from the first amplification circuit (21) and the second output voltage (V3) from the second amplification circuit (22). Subsequently, VCM is connected to the non-inverting (positive) input of the first amplifier (AMP1) within the first amplification circuit (21) and to the non-inverting (positive) input of the second amplifier (AMP2) within the second amplification circuit (22), respectively.

In some embodiments, referring to FIG. 3, a Sigma-Delta (Σ-Δ) measurement circuit, also known as a feedback loop, is created by integrating several components. These include the first and second amplifiers (AMP1 and AMP2), the differential amplifier (AMP4), the comparator (311), and the digital-to-analog converter (DAC) (321). Additionally, the first and second capacitors (Cint1 and Cint2) and the first and second switches (rst1 and rst2) are integral parts of this circuit configuration.

The positive input terminals of AMP1 and AMP2 receive a common-mode signal (VCM), while their negative input terminals receive a feedback signal (error signal). AMP1 and AMP2 perform a differential (delta) comparison on the input common-mode signal (VCM) and the feedback signal. The differential output from this comparison is fed into the differential amplifier AMP4 (sigma), whose output, in turn, is fed into the comparator (311). Each alternate operation of AMP1 and AMP2 reduces the difference between the first output voltage (V2) and the second output voltage (V3). The result of each operation, comp_out, is transmitted to the DAC (321) along with the readings of the first output voltage (V2) and the second output voltage (V3) from the first and second sub-capacitors (C1 and C2). Thus, each comparison result, comp_out, forms a digital signal in the DAC (321) and is fed back to the negative input terminals of AMP1 and AMP2.

It is noted that after multiple comparison cycles involving alternate activation of the first and second timing switch circuits (clk1 and clk2), a capacitance value for the capacitor under test (Cs) is obtained with certain precision. Here, the integration amplifier circuit (20) and the capacitance detection circuit form a closed-loop, allowing for multiple comparisons of the signal value collected by the capacitance. This proposed process implements negative feedback control and conversion of the current signal through the capacitor under test, achieving dynamic balance between the current through the capacitor under test and the reference capacitor current. This approach enhances the stability and precision of capacitance detection.

When the first switch (rst1), the second switch (rst2), and the third switch (rst3) are closed, the first capacitor (Cint1), the second capacitor (Cint2), and the variable capacitor (Cint3) are discharged and perform charge transfer. Due to the closed-loop characteristics of the amplifiers, the first input voltage (V1) at the negative input of the third amplifier (AMP3), the first output voltage (V2) at the negative input of the first amplifier (AMP1), and the second output voltage (V3) at the negative input of the second amplifier (AMP2) all become a common-mode signal (VCM). This resets the circuit to its state before the capacitance sampling, completing a cycle of the capacitance measurement process.

Furthermore, when there is low-frequency signal interference from the outside, this interference signal is transmitted through the excitation circuit and further to the first amplification circuit (21) and the second amplification circuit (22). After differential processing by the differential amplifier (AMP4), the low-frequency interference is eliminated, giving the entire system a strong low-frequency suppression capability.

Some embodiments also include an excitation capacitor (Cdrv), one end of which is connected to the adjustment circuit (11) and the other end to the integration comparison circuit (20).

In summary, the approach outlined above introduces a differential system that includes the first and second amplification circuits (21 and 22) along with the differential amplifier (AMP4). This configuration is particularly effective in eliminating low-frequency interference signals. It does so by utilizing differential processing with AMP4, which significantly improves the system's ability to filter out low-frequency noise. Furthermore, the integration amplifier circuit (20) works in conjunction with the capacitance detection circuit to create a feedback loop. This setup facilitates repeated comparisons of the signal from the capacitor under test (Cs), enabling negative feedback control and signal conversion. The process ensures a balance between the currents of the test capacitor and a reference capacitor, ultimately enhancing the accuracy and stability of capacitance measurements.

In line with this application, we introduce a method for measuring capacitance that utilizes the capacitance measurement circuit described earlier. The method unfolds in two main phases:

Sampling Phase: The capacitor being tested is linked to the excitation circuit for the purpose of charge sampling. During this phase, the third switch (rst3), along with the first (rst1) and second switches (rst2), are set to the open position in response to a capacitance control signal.

Integration Phase: The charge gathered from the test capacitor is moved to the capacitance measurement circuit. This phase involves the alternating activation of the first timing switch circuit (clk1) and the second timing switch circuit (clk2), guided by the capacitance control signal. The accumulated charge within the measurement circuit is then converted into voltage. From this voltage, the capacitance value of the test capacitor is derived.

The specifics of this capacitance measurement method have been outlined in the preceding examples and will not be repeated here for brevity.

The various embodiments are categorized for ease of description and do not limit the specific implementations of this application. They can be combined and referenced interchangeably, provided there are no contradictions.

The division of steps in these methods is for clarity of description. In implementation, they can be combined into one step or further divided into multiple steps, if they maintain the same logical relationship. Any minor modifications or non-essential additions to the algorithm or process that do not change its core design are within the scope of this disclosure.

Those skilled in the art will understand that the above embodiments are specific implementations of this application, and various modifications can be made in form and detail in actual applications without departing from the spirit and scope of this application.

The invention claimed is:

1. A capacitance measurement circuit comprising:

An excitation circuit and an adjustment circuit configured to connect with a capacitor to be measured, wherein the capacitor is arranged between the output of the excitation circuit and the input of the adjustment circuit;

an integration comparison circuit connected to the adjustment circuit, the integration comparison circuit comprising:

a first timing switch circuit and a second timing switch circuit, each configured to alternate activation; and a first amplification circuit connected to the first timing switch circuit, and a second amplification circuit connected to the second timing switch circuit, wherein the first timing switch circuit is connected between the output of the adjustment circuit and the input of the first amplification circuit, and the second timing switch circuit is connected between the output of the adjustment circuit and the input of the second amplification circuit:

and, a capacitance detection circuit comprising:

a differential amplifier having an in-phase input connected to the output of the first amplification circuit and an inverting input connected to the output of the second amplification circuit; and a comparator connected to the output of the differential amplifier, wherein the output of the comparator is configured to connect to the inputs of both the first and second amplification circuits.

2. The capacitance measurement circuit of claim 1, further comprising a digital-to-analog conversion circuit, wherein the output of the comparator is connected to the input of the digital-to-analog conversion circuit, and the output of the digital-to-analog conversion circuit is connected to the inputs of both the first amplification circuit and the second amplification circuit.

3. The capacitance measurement circuit of claim 2, wherein the output of the digital-to-analog conversion circuit is connected to the negative input terminal of the first amplifier of the first amplification circuit, and the output of the digital-to-analog conversion circuit is also connected to the negative input terminal of the second amplifier of the second amplification circuit.

4. The capacitance measurement circuit of claim 2, wherein the digital-to-analog conversion circuit comprises a digital-to-analog converter, wherein the digital-to-analog converter is connected to the positive input terminals of the first amplifier of the first amplification circuit and the first amplifier of the second amplification circuit based on a common-mode signal formed by the first output voltage from the first amplification circuit and the second output voltage from the second amplification circuit.

5. The capacitance measurement circuit of claim 4, wherein the first amplification circuit includes a first amplifier, a first capacitor, and a first switch, with one end of the first capacitor being connected to the negative input terminal of the first amplifier, to the first timing switch circuit, and to one terminal of the first switch, and the other end of the first capacitor being connected to the output terminal of the first amplifier and to the opposite terminal of the first switch.

6. The capacitance measuring circuit of claim 5, wherein the second amplifying circuit comprises: a second amplifier, a second capacitor, and a second switch, with one end of the second capacitor being connected to the negative input terminal of the second amplifier, the second timing switch circuit, and the second switch, and the other end of the second capacitor being connected to the output terminal of the second amplifier and the other end of the second switch.

7. The capacitance measuring circuit of claim 4, wherein the adjustment circuit comprises a variable capacitor, a third amplifier, and a third switch, wherein one end of the variable capacitor is connected to the negative input terminal of the third amplifier, the third switch, and the capacitor under test, and the other end of the variable capacitor being connected to the output terminal of the third amplifier and the other end of the third switch, and the positive input terminal of the third amplifier receiving the common-mode signal.

8. The capacitance measuring circuit of claim 7, wherein the output voltage (Vout) of the third amplifier and the excitation voltage (Vdrv) outputted by the excitation circuit satisfy the following relationship:

$$Vout/Vdrv = -(A \times Cs)/[(A+1) \times Cint + Cs],$$

wherein A is the amplification factor of the third amplifier, Cs is the capacitance value of the capacitor under test, and Cint is the capacitance value of the variable capacitor.

9. The capacitance measuring circuit according to claim 1, further comprising: an excitation capacitor, wherein one end of the excitation capacitor is connected to the adjustment circuit, and the other end of the excitation capacitor is connected to the integration comparison circuit.

10. A method for measuring capacitance, comprising:

providing a capacitance measuring circuit, wherein said capacitance measuring circuit is any one of the capacitance measuring circuits described in claim 1;

during a sampling stage of capacitance measurement, connecting the capacitor under test to the excitation circuit to perform charge sampling, and controlling the third switch, the first switch, and the second switch to be in an open state based on a capacitance control signal; and during an integration stage of capacitance measurement, transferring the charge collected by the capacitor under test to the said capacitance measuring circuit, and controlling the opening of the first timing switch circuit and the alternating opening of the second timing switch circuit based on the said capacitance control signal; converting the integrated charge on the said capacitance measuring circuit into voltage, and calculating the capacitance value of the capacitor under test based on the said voltage.

* * * * *